United States Patent
Gouk et al.

(10) Patent No.: US 11,133,174 B2
(45) Date of Patent: Sep. 28, 2021

(54) REDUCED VOLUME PROCESSING CHAMBER

(71) Applicant: Applied Materials, Inc., Santa Clara, CA (US)

(72) Inventors: Roman Gouk, San Jose, CA (US); Han-Wen Chen, Cupertino, CA (US); Steven Verhaverbeke, San Francisco, CA (US); Jean Delmas, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 166 days.

(21) Appl. No.: 16/352,631

(22) Filed: Mar. 13, 2019

(65) Prior Publication Data

US 2019/0214247 A1 Jul. 11, 2019

Related U.S. Application Data

(63) Continuation of application No. 15/268,173, filed on Sep. 16, 2016, now abandoned.

(60) Provisional application No. 62/236,914, filed on Oct. 4, 2015.

(51) Int. Cl.
*H01L 21/02* (2006.01)
*H01L 21/67* (2006.01)

(52) U.S. Cl.
CPC .... *H01L 21/02041* (2013.01); *H01L 21/6704* (2013.01); *H01L 21/6719* (2013.01); *H01L 21/67034* (2013.01); *H01L 21/0206* (2013.01); *H01L 21/02057* (2013.01); *H01L 21/02101* (2013.01)

(58) Field of Classification Search
CPC ......... H01L 21/02041; H01L 21/67034; H01L 21/6704; H01L 21/6719; H01L 21/02057; H01L 21/0206; H01L 21/02101
USPC .......................................................... 134/34
See application file for complete search history.

(56) References Cited

U.S. PATENT DOCUMENTS

| 5,417,768 | A  | 5/1995  | Smith, Jr. et al. |
| 5,968,273 | A  | 10/1999 | Kadomura et al. |
| 6,286,231 | B1 | 9/2001  | Bergman et al. |
| 6,306,564 | B1 | 10/2001 | Mullee |
| 6,334,266 | B1 | 1/2002  | Moritz et al. |
| 6,508,259 | B1 | 1/2003  | Tseronis et al. |

(Continued)

FOREIGN PATENT DOCUMENTS

| CN | 1958177 A | 5/2007 |
| CN | 1960813 A | 5/2007 |

(Continued)

OTHER PUBLICATIONS

Office Action for Japanese Application No. 2019-232387 dated Oct. 27, 2020.

(Continued)

*Primary Examiner* — Tinsae B Ayalew
(74) *Attorney, Agent, or Firm* — Patterson + Sheridan LLP

(57) ABSTRACT

Embodiments described herein generally relate to a processing chamber having a reduced volume for performing supercritical drying processes or other phase transition processes. The chamber includes a substrate support moveably disposed on a first track and a door moveably disposed on a second track. The substrate support and door may be configured to move independently of one another and the chamber may be configured to minimize vertical movement of the substrate within the chamber.

18 Claims, 5 Drawing Sheets

(56) References Cited

U.S. PATENT DOCUMENTS

| | | | |
|---|---|---|---|
| 6,562,146 B1 | 5/2003 | DeYoung et al. | |
| 6,745,494 B2 | 6/2004 | Bergman et al. | |
| 6,764,552 B1 | 7/2004 | Joyce et al. | |
| 6,793,836 B2 | 9/2004 | Tsung-Kuei et al. | |
| 6,843,855 B2 | 1/2005 | Verhaverbeke | |
| 6,848,458 B1 | 2/2005 | Shrinivasan et al. | |
| 7,000,621 B1 | 2/2006 | Verhaverbeke | |
| 7,384,484 B2 | 6/2008 | Muraoka et al. | |
| 2002/0195121 A1 | 12/2002 | Kittle | |
| 2003/0022487 A1 | 1/2003 | Yoon et al. | |
| 2003/0026677 A1 | 2/2003 | Sakashita et al. | |
| 2003/0075536 A1 | 4/2003 | Mack et al. | |
| 2003/0084918 A1 | 5/2003 | Kim | |
| 2003/0102017 A1 | 6/2003 | Taniyama | |
| 2003/0177659 A1 | 9/2003 | Saito et al. | |
| 2004/0072706 A1 | 4/2004 | Arena-Foster et al. | |
| 2004/0198066 A1 | 10/2004 | Verhaverbeke | |
| 2005/0191861 A1 | 9/2005 | Verhaverbeke | |
| 2005/0242064 A1 | 11/2005 | Saito et al. | |
| 2006/0223899 A1 | 10/2006 | Hillman et al. | |
| 2007/0221252 A1 | 9/2007 | Kiyose | |
| 2007/0287277 A1 | 12/2007 | Kolics et al. | |
| 2007/0295365 A1 | 12/2007 | Miya et al. | |
| 2008/0153276 A1 | 6/2008 | Hwang et al. | |
| 2008/0224379 A1 | 9/2008 | McNamara | |
| 2009/0151754 A1 | 6/2009 | Zhu et al. | |
| 2011/0146909 A1 | 6/2011 | Shih et al. | |
| 2012/0055405 A1 | 3/2012 | Koelmel et al. | |
| 2012/0085495 A1 | 4/2012 | Lee et al. | |
| 2012/0103264 A1 | 5/2012 | Choi et al. | |
| 2012/0111379 A1 | 5/2012 | Nixon et al. | |
| 2012/0304485 A1 | 12/2012 | Hayashi et al. | |
| 2013/0194350 A1 | 8/2013 | Watanabe et al. | |
| 2013/0224956 A1 | 8/2013 | Negoro et al. | |
| 2013/0302982 A1 | 11/2013 | Tung et al. | |
| 2013/0318812 A1 | 12/2013 | Kim et al. | |
| 2014/0144462 A1 | 5/2014 | Verhaverbeke et al. | |
| 2014/0283746 A1 | 9/2014 | Seo et al. | |
| 2015/0221539 A1 | 8/2015 | Ouye | |
| 2015/0262859 A1 | 9/2015 | Balasubramanian et al. | |

FOREIGN PATENT DOCUMENTS

| | | |
|---|---|---|
| CN | 102386052 A | 3/2012 |
| EP | 1172458 A2 | 1/2002 |
| JP | H07-142378 A | 6/1995 |
| JP | 110-135171 A | 5/1998 |
| JP | 2001-77074 A | 3/2001 |
| JP | 2003-51474 A | 2/2003 |
| JP | 2003-282510 A | 10/2003 |
| JP | 2003-282524 A | 10/2003 |
| JP | 2004186526 A | 7/2004 |
| JP | 2004-249189 A | 9/2004 |
| JP | 2004-311507 A | 11/2004 |
| JP | 2005-116759 A | 4/2005 |
| JP | 2005-138063 A | 6/2005 |
| JP | 2005-333015 A | 12/2005 |
| JP | 2006-179913 A | 7/2006 |
| JP | 2007-049065 A | 2/2007 |
| JP | 2008-034656 A | 2/2008 |
| JP | 2008-73611 A | 4/2008 |
| JP | 2008-98558 A | 4/2008 |
| JP | 2008-159789 A | 7/2008 |
| JP | 2010-045170 A | 2/2010 |
| JP | 2010-051470 A | 3/2010 |
| JP | 2011-040572 A | 2/2011 |
| JP | 2012-503883 A | 2/2012 |
| JP | 2012-124441 A | 6/2012 |
| JP | 2012-204656 A | 10/2012 |
| JP | 2013-033962 A | 2/2013 |
| JP | 2013-105777 A | 5/2013 |
| JP | 2013-120944 A | 6/2013 |
| JP | 2013-179244 A | 9/2013 |
| JP | 2014-241450 A | 12/2014 |
| JP | 2015-144239 A | 8/2015 |
| KR | 100171945 | 3/1999 |
| KR | 10-2005-0032943 A | 4/2005 |
| KR | 100730348 B1 | 6/2007 |
| KR | 10-2005-0063720 | 11/2007 |
| KR | 1020070113096 | 11/2007 |
| KR | 10-2008-0002633 | 1/2008 |
| KR | 10-0822373 B1 | 4/2008 |
| KR | 10-2010-0128123 A | 12/2010 |
| KR | 10-2013-0063761 | 6/2013 |
| KR | 10-2014-0115795 A | 10/2014 |
| TW | I233147 B | 5/2005 |
| TW | I245322 B | 12/2005 |
| TW | 201241895 A | 10/2012 |
| TW | 201426850 A | 7/2014 |
| TW | 201534407 A | 9/2015 |
| WO | 2010/036575 A2 | 4/2010 |
| WO | 2011/103062 A2 | 8/2011 |
| WO | 2012133583 A1 | 10/2012 |

OTHER PUBLICATIONS

Office Action for Japanese Application No. 2019-129241 dated Dec. 1, 2020.
Office Action for Korean Application No. 10-2019-7038899 dated Feb. 18, 2020.
International Search Report and Written Opinion of related application PCT/US2016/051520 dated Dec. 26, 2016.
International Search Report an Written Opinion for International Application No. PCT/US2016/051341 dated Dec. 20, 2016.
International Search Report & Written Opinion dated Mar. 17, 2014 for Application No. PCT/US2013/071314.
International Search Report and Written Opinion of related application PCT/US2016/051480 dated Jan. 5, 2017.
International Search Report and Written Opinion for related application PCT/US2016/051582 dated Dec. 22, 2016.
International Search Report and Written Opinion, PCT/US2015/039974, dated Oct. 29, 2015.
Taiwan Office Action in related application TW 102140520 dated Apr. 17, 2017.
Office Action for Taiwan Application No. 105131243 dated Aug. 20, 2019.
Search Report for Taiwan Application No. 105131243 dated Aug. 19, 2019.
JP Office Action dated Jul. 8, 2020 for Application No. 2019-129241.
Office Action for Taiwan Application No. 108125950 dated Oct. 18, 2019.
Search Report for Taiwan Application No. 108125950 dated Oct. 18, 2019.
Office Action for Japan Application No. 2018-517285 dated Oct. 23, 2019.
Office Action for Taiwan Application No. 105130171 dated Jul. 15, 2019.
Search Report for Taiwan Application No. 105130171 dated Jul. 9, 2019.
Office Action for Japanese Application No. 2018-517285 dated Mar. 26, 2019.
Notice of Allowance for Japan Application No. 2018-517344 dated Dec. 2, 2019.
Office Action for Korean Application No. 10-2015-7016291 dated Dec. 19, 2019.
Office Action for Korean Application No. 10-2018-7012657 dated May 21, 2019.
Office Action for Korean Application No. 10-2018-7012655 dated May 21, 2019.
Office Action for Korean Application No. 10-2018-7012656 dated May 21, 2019.
Office Action for Japanese Application No. 2018-517344 dated Jun. 4, 2019.
Office Action for Japanese Application No. 2018-517340 dated Apr. 9, 2019.
Office Action for Japanese Application No. 2018-546484 dated Oct. 8, 2019.
Taiwan Notice of Allowance for Application No. 108135965.

(56) References Cited

OTHER PUBLICATIONS

Korean Office Action dated Feb. 26, 2021, for Korean Patent Application No. 10-2020-7034920.
Japanese Decision to Grant a Patent dated Jun. 29, 2021, for Japanese Patent Application No. 2019-232387.

REDUCED VOLUME PROCESSING CHAMBER

CROSS-REFERENCE TO RELATED APPLICATIONS

This application is a continuation of U.S. patent application Ser. No. 15/268,173, filed Sep. 16, 2016, which application claims priority to U.S. Provisional Patent Application Ser. No. 62/236,914, filed Oct. 4, 2015, each of which are herein incorporated by reference.

BACKGROUND

Field

Embodiments of the present disclosure generally relate to supercritical drying apparatus. More specifically, embodiments described herein relate to a reduced volume processing chamber.

Description of the Related Art

In the cleaning of semiconductor devices, it is often desirable to remove liquid and solid contaminants from surfaces of a substrate, thus leaving clean surfaces. Wet cleaning processes generally involve the use of cleaning liquids, such as aqueous cleaning solutions. After wet cleaning the substrate, it is often desirable to remove the cleaning liquid from the surface of the substrate in a cleaning chamber.

Most current wet cleaning techniques utilize a liquid spraying or immersion step to clean the substrate. Drying of the substrate that has high aspect ratio features or low-k materials which have voids or pores is very challenging subsequent to the application of a cleaning liquid. Capillary forces of the cleaning liquid often cause deformation of materials in these structures which can create undesired stiction, which can damage the semiconductor substrate in addition to leaving residue on the substrate from the cleaning solution utilized. The aforementioned drawbacks are especially apparent on substrates with high-aspect-ratio semiconductor device structures during subsequent drying of the substrate. Line stiction, or line collapse, results from bending of the side walls, which form the high-aspect-ratio trench or via, towards each other due to capillary pressure across the liquid-air interface over the liquid trapped in the trench or via during the wet cleaning process(es). Features with narrow line width and high-aspect-ratios are especially susceptible to the difference in surface tension created between liquid-air and liquid-wall interfaces due to capillary pressure, which is also sometimes referred to as capillary force. Current workable drying practices are facing a steeply rising challenge in preventing line stiction as a result of rapid device scaling advancements.

As a result, there is a need in the art for improved apparatus for performing supercritical drying processes.

SUMMARY

In one embodiment, a substrate processing apparatus is provided. The apparatus includes a processing chamber body having a liner defining a processing volume and an insulation element formed in the chamber body. A door may be slidably coupled to a first track and the door may be configured to move relative to the chamber body. A substrate support may be slidably coupled to a second track and the substrate may be configured to move independently of the door.

In another embodiment, a substrate processing apparatus is provided. The apparatus includes a chamber body having an opening formed therein and the opening provides ingress and egress from a processing volume defined by a liner of the chamber body. A baffle plate may be disposed within the processing volume and the baffle plate may be coupled to an actuator configured to move the baffle plate within the processing volume. A door may be slidably coupled to a first track and the door may be configured to translate between an open position and a closed position. A substrate support may be slidably coupled to a second track and the substrate support may be configured to translate between a first position outside of the processing volume and a second position inside the processing volume. The substrate support may also be configured to move independently of the door.

In yet another embodiment, a substrate processing method is provided. The method includes positioning a door in an open orientation relative to a chamber body and positioning a substrate support in an open orientation relative to the chamber body. A substrate may be positioned on the substrate support and a baffle plate may be positioned over the substrate disposed on the substrate support. The substrate support may be slid into the chamber body and the door may be slid to abut the chamber body. The sliding of the substrate support and the sliding of the door may be performed independently.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, for purposes of explanation, numerous specific details are set forth in order to provide a thorough understanding of the embodiments provided herein. However, it will be evident to one skilled in the art that the present disclosure may be practiced without these specific details. In other instances, specific apparatus structures have not been described so as not to obscure embodiments described. The following description and figures are illustrative of the embodiments and are not to be construed as limiting the disclosure.

Figure 1:
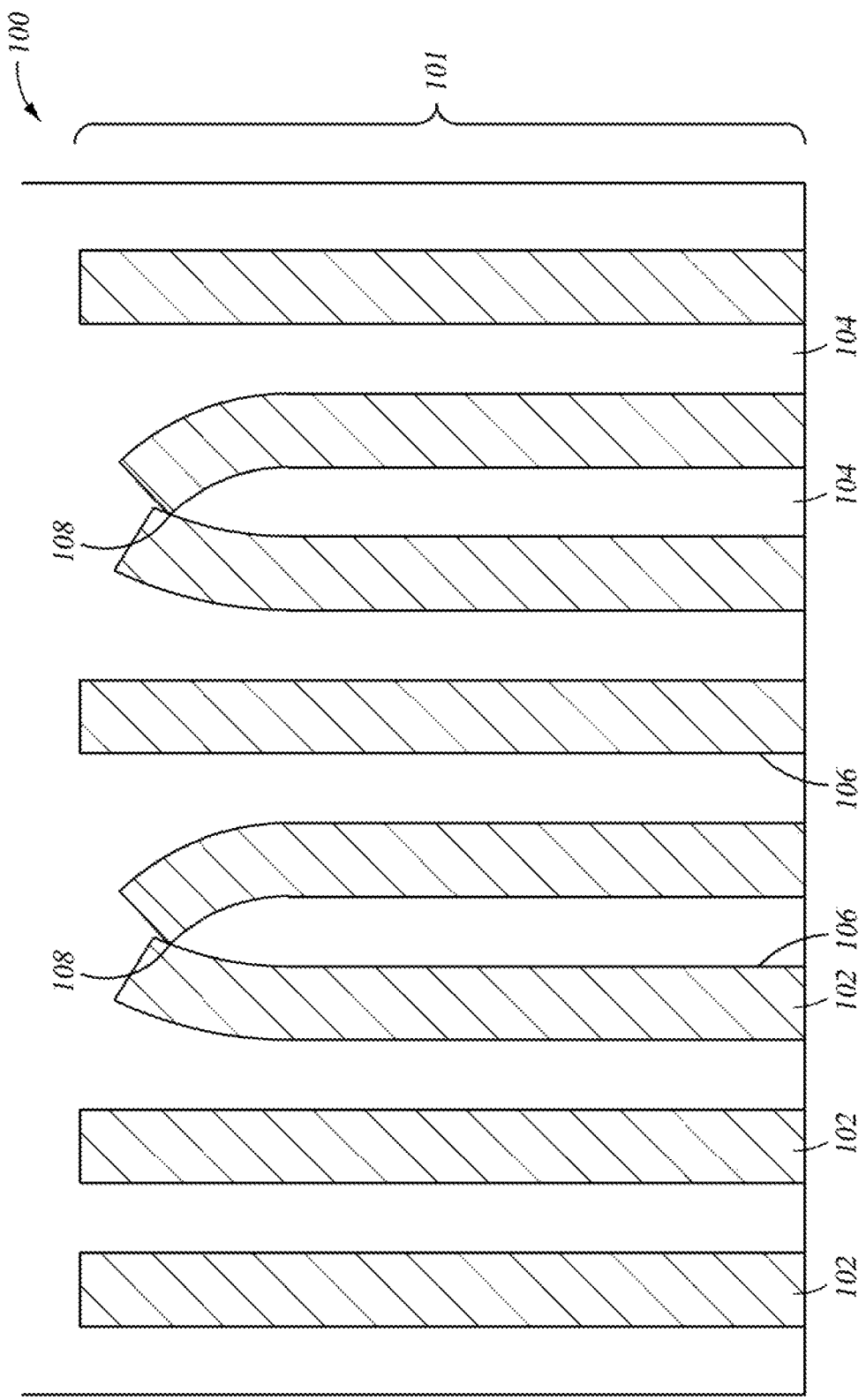
FIG. 1 illustrates the effect of stiction created between features formed on a semiconductor substrate according to embodiments described herein.

FIG. 1 is a schematic cross-sectional view that illustrates a portion of a semiconductor device 100 in which line stiction has occurred between two features within the semiconductor device 100. As shown, the high aspect ratio device structures are formed on a surface of a substrate. During processing, device structures 102 should remain in a vertical orientation and walls 106 should not cross the openings 104 and contact adjacent walls 106 of the device structures 102. When the semiconductor device 100 is being dried after being cleaned with wet chemistries, the walls 106 of the device structures 102 are subjected to capillary forces due to the air-liquid interface created by the cleaning liquid disposed within the opening 104, which causes the walls 106 of adjacent device structures 102 to bend towards one another and contact each other. Line stiction results from the contact between walls 106 of adjacent device structures 102, ultimately causing closure of the openings 104. Line stiction is generally undesirable because it prevents access to the openings 104 during subsequent substrate processing steps, such as further deposition steps.

To prevent line stiction, a substrate may be exposed to an aqueous cleaning solution, such as de-ionized water or cleaning chemicals, in a wet clean chamber. Such a substrate includes a semiconductor substrate having electronic devices disposed or formed thereon. The use of the aqueous cleaning solutions on the substrate in a wet clean chamber removes residues left on the substrate after the wet cleaning processes have been performed. In some configurations, the wet clean chamber may be a single wafer cleaning chamber and/or a horizontal spinning chamber. Additionally, the wet clean chamber may have a megasonic plate adapted to generate acoustic energy directed onto the non-device side of the substrate.

After wet cleaning the substrate, the substrate may be transferred to a solvent exchange chamber to displace any previously used aqueous cleaning solutions used in the wet clean chamber. The substrate may then be transferred to a supercritical fluid chamber for further cleaning and drying steps to be performed on the substrate. In one embodiment, drying the substrate may involve the delivery of a supercritical fluid to a surface of the substrate. A drying gas may be selected to transition into a supercritical state when subjected to certain pressure and temperature configurations that are achieved or maintained in the supercritical processing chamber. One example of such a drying gas includes carbon dioxide ($CO_2$). Since supercritical $CO_2$ is a supercritical gas, it has no surface tension in that its surface tension is similar to a gas, but has densities that are similar to a liquid. Supercritical $CO_2$ has a critical point at a pressure of about 73.0 atm and a temperature of about 31.1° C. One unique property of a supercritical fluid, such as $CO_2$, is that condensation will not occur at any pressure above the supercritical pressure and temperatures above the supercritical point (e.g., 31.1° C. and 73 atm for $CO_2$). Critical temperature and critical pressure parameters of a processing environment, such as a processing chamber, influence the supercritical state of the $CO_2$ drying gas.

The supercritical fluid, due to its unique properties, may penetrate substantially all pores or voids in the substrate and remove any remaining liquids or particles that may be present in the openings 104. In one embodiment, after the supercritical processing has proceeded for a desired period of time to remove particles and residues, the pressure of the chamber is decreased at a nearly constant temperature, allowing the supercritical fluid to transition directly to a gaseous phase within the openings 104. Liquids typically present in the openings 104 prior to supercritical fluid treatment may be displacement solvents from the solvent exchange chamber. Particles typically present in the openings 104 may be any solid particulate matter, such as organic species (i.e., carbon), inorganic species (i.e. silicon), and/or metals. Examples of openings 104 that may be dried by supercritical fluid include voids or pores in a dielectric layer, voids or pores in a low-k dielectric material, and other types of gaps in the substrate that may trap cleaning fluids and particles. Moreover, supercritical drying may prevent line stiction by bypassing the liquid state during phase transition and eliminating capillary forces created between the walls 106 of the device structures 102 due to the negligible surface tension of supercritical fluid, such as supercritical $CO_2$.

The substrate may then be transferred from the supercritical fluid chamber to a post processing chamber. The post processing chamber may be a plasma processing chamber, in which contaminants that may be present on the substrate may be removed. Post processing the substrate may also further release any line stiction present in the device structures. The processes described herein are useful for cleaning device structures having high aspect ratios, such as aspect ratios of about 10:1 or greater, 20:1 or greater, or 30:1 or greater. In certain embodiments, the processes described herein are useful for cleaning 3D/vertical NAND flash device structures.

Figure 2A:
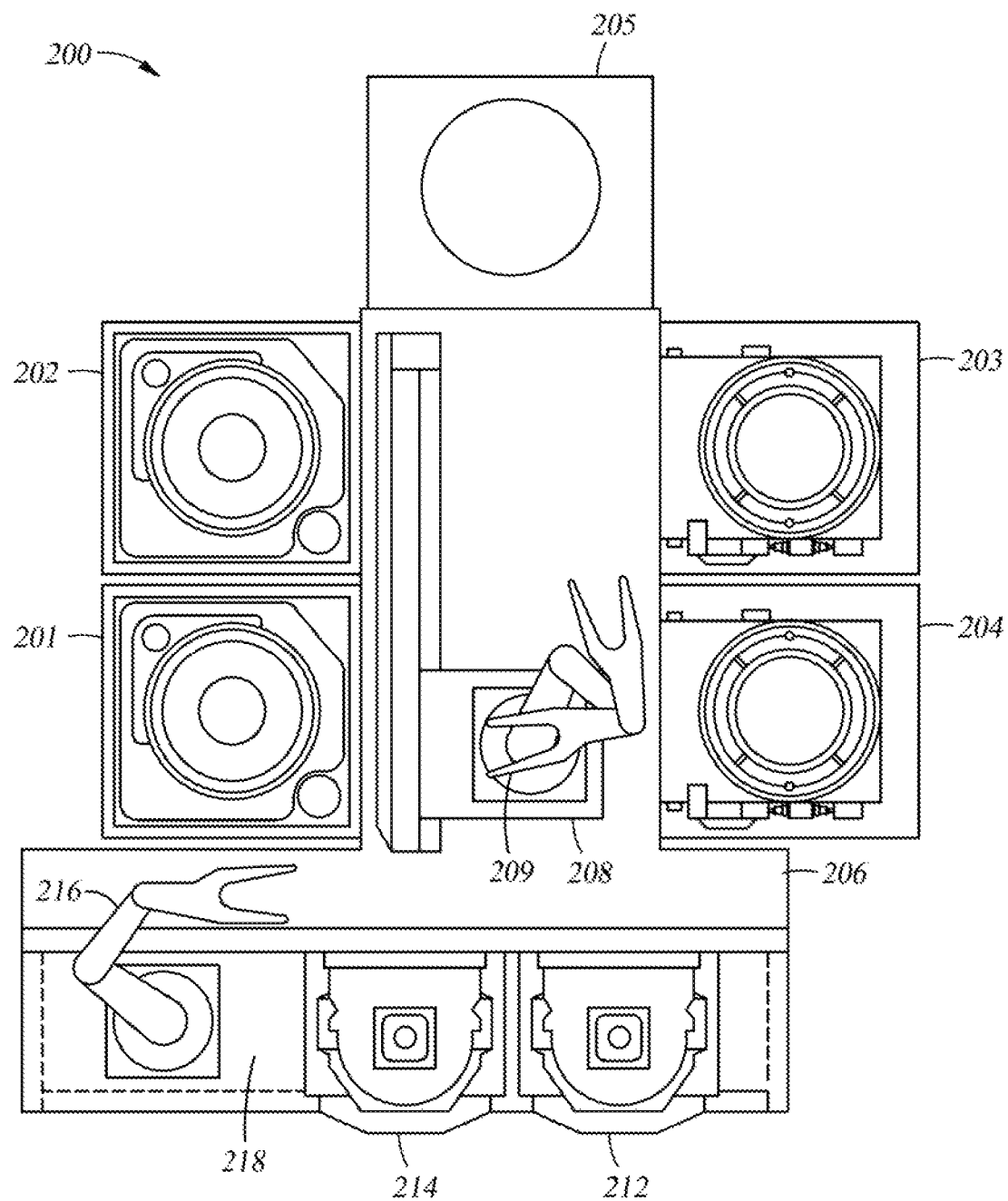
FIG. 2A illustrates a plan view of processing apparatus according to one embodiment described herein.

FIG. 2A illustrates a substrate processing apparatus that may be adapted to perform one or more of the operations described above, according to one embodiment of the present disclosure. In one embodiment, the processing apparatus 200 comprises a wet clean chamber 201, a solvent exchange chamber 202, a supercritical fluid chamber 203, a post processing chamber 204, a transfer chamber 206, and a wet robot 208. Processing a substrate may include, but is not limited to, forming electrical devices such as transistors, capacitors, or resistors, that are interconnected by metal lines, which are insulated by interlayer dielectrics upon the substrate. These processes may include cleaning the substrate, cleaning films formed on the substrate, drying the substrate, and drying films formed on the substrate. In another embodiment, the processing apparatus 200 includes an inspection chamber 205, which may include tools (not shown) to inspect substrates that have been processed in the processing apparatus 200.

In one embodiment, the substrate processing apparatus 200 is a cluster tool comprising several substrate processing chambers, such as the wet clean chamber 201, the solvent exchange chamber 202, the supercritical fluid chamber 203, the post processing chamber 204, and the transfer chamber 206. The chambers 201, 202, 203, 204 may be positioned about the wet robot 208 which may be disposed in the transfer chamber 206. The wet robot 208 comprises a motor, a base, an arm, and an end effector 209 configured to transfer substrates between the chambers. Optionally, the wet robot 208 may have multiple arms and multiple end effectors to increase the throughput of the processing apparatus 200. In one embodiment, the wet robot 208 transfers substrates between the aforementioned chambers. In another embodiment, at least one of the end effectors of the wet robot 208 is a dedicated dry end effector (e.g., adapted to handle dry wafers) and at least one of the end effectors of the wet robot 208 is a dedicated wet end effector (e.g., adapted to handle wet wafers). The dedicated dry end effector may be used to transfer substrates between the supercritical fluid chamber 203 and the post processing chamber 204.

The processing apparatus 200 also comprises a dry robot 216 disposed in a factory interface 218 which may be coupled to the processing apparatus 200 and a plurality of substrate cassettes 212 and 214, each holding a plurality of substrates to be cleaned or dried, or that have been cleaned or dried. The dry robot 216 may be configured to transfer substrates between the cassettes 212 and 214 and the wet clean chamber 201 and post processing chamber 204. In another embodiment, the dry robot 216 may be configured to transfer substrates between the supercritical fluid chamber 203 and the post processing chamber 204. The processing chambers within the processing apparatus 200 may be placed on a horizontal platform which houses the substrate transfer chamber 206. In another embodiment, a portion of the platform may be oriented in a position other than a horizontal orientation (See FIG. 4).

Figure 2B:
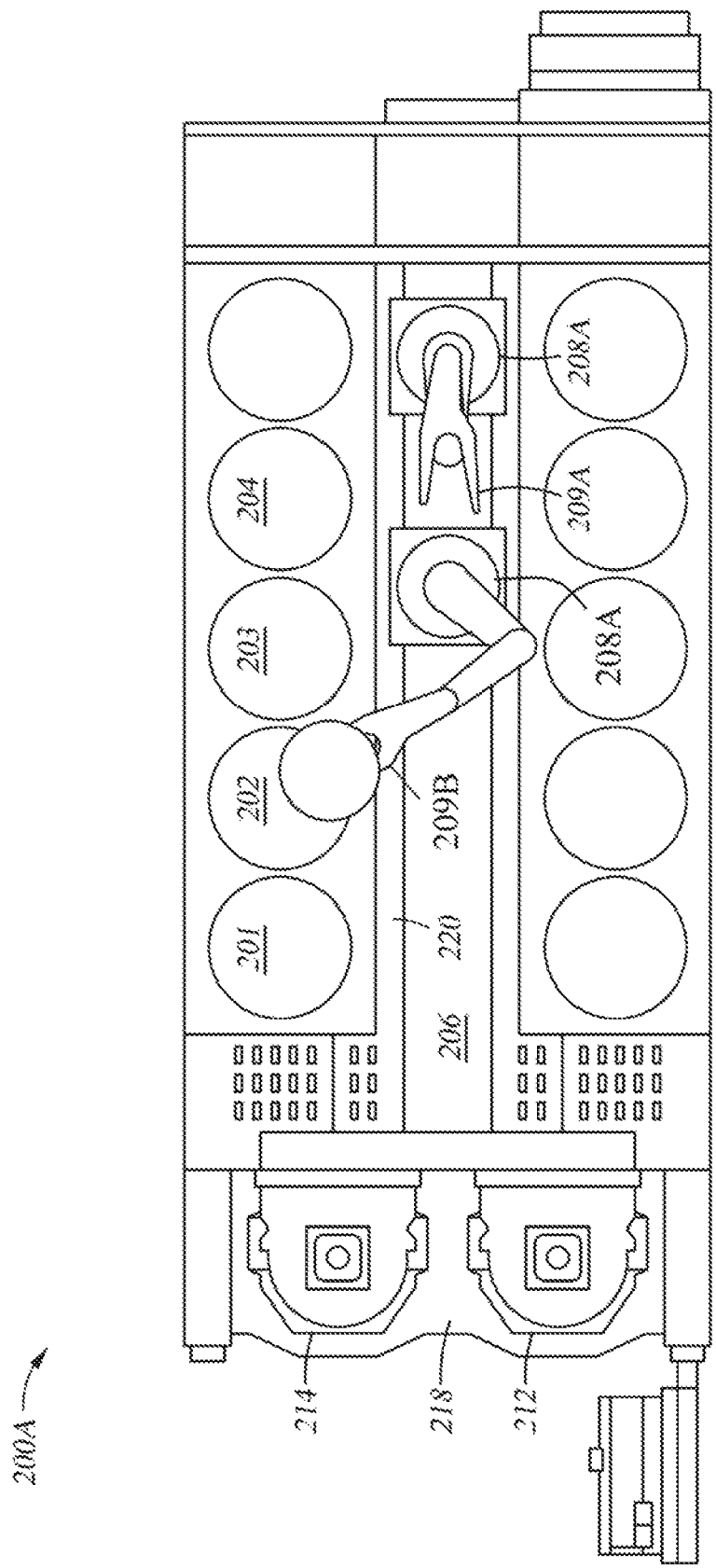
FIG. 2B illustrates a plan view of a processing apparatus according to one embodiment described herein.

In an alternate embodiment, as shown in FIG. 2B, the processing apparatus 200A may be a linear apparatus comprising several substrate processing chambers such as the wet clean chamber 201, the solvent exchange chamber 202, the supercritical fluid chamber 203, the post processing chamber 204, and the transfer chamber 206. For example, the processing apparatus 200A may be the Raider® GT available from Applied Materials, Santa Clara, Calif., however it is contemplated that other processing apparatuses from other manufacturers may be adapted to perform the embodiments described herein.

The chambers 201, 202, 203, 204 may be positioned about a robot 208A which may be disposed in the transfer chamber 206. The robot 208A comprises a motor, a base, an arm, and end effectors 209A and 209B configured to transfer substrates between the chambers. The robot 208A may have multiple arms and multiple end effectors to increase the throughput of the processing apparatus 200A. In one embodiment, the robot 208A, having a dedicated wet end effector 209A, transfers substrates between the aforementioned chambers. The processing apparatus 200A may also comprise a factory interface 218 which may be coupled to the processing apparatus 200 and a plurality of substrate cassettes 212 and 214, each holding a plurality of substrates to be cleaned or dried, or that have been cleaned or dried. The robot 208A having the dedicated dry end effector 209B, transfers substrates between the cassettes 212 and 214 and the wet clean chamber 201 and post processing chamber 204. In one embodiment, the dedicated dry end effector 209B may be configured to transfer substrates between the supercritical fluid chamber 203 and the post processing chamber 204. The chambers within the processing apparatus 200A may be placed on a horizontal platform which houses the substrate transfer chamber 206. In another embodiment, a portion of the platform may be oriented in a position other than a horizontal orientation (See FIG. 4).

In some configurations of the processing apparatus 200A, the robot 208A may travel along a linear track 220. Chambers may be arranged in sequence on one or both sides of the linear track 220. To perform wet substrate transfer, excess liquid may be remove from the substrate, such as by rotating the substrate, while still in the chamber so only a thin wet layer remains on the substrate surface before the robot 208A transfers the substrate. In embodiments providing two or more end effectors on the robot 208A, at least one may be dedicated to wet substrate transfer and the other one may be dedicated to dry substrate transfer. More chambers may be installed in the extendable linear configuration for high-volume production.

The configurations referred to in the previous embodiments greatly reduce design complexities of each chamber, enable queue time control between sensitive process steps, and optimize throughput in continuous production with adjustable chamber module count to equalize process duration of each processing operation.

Figure 3:
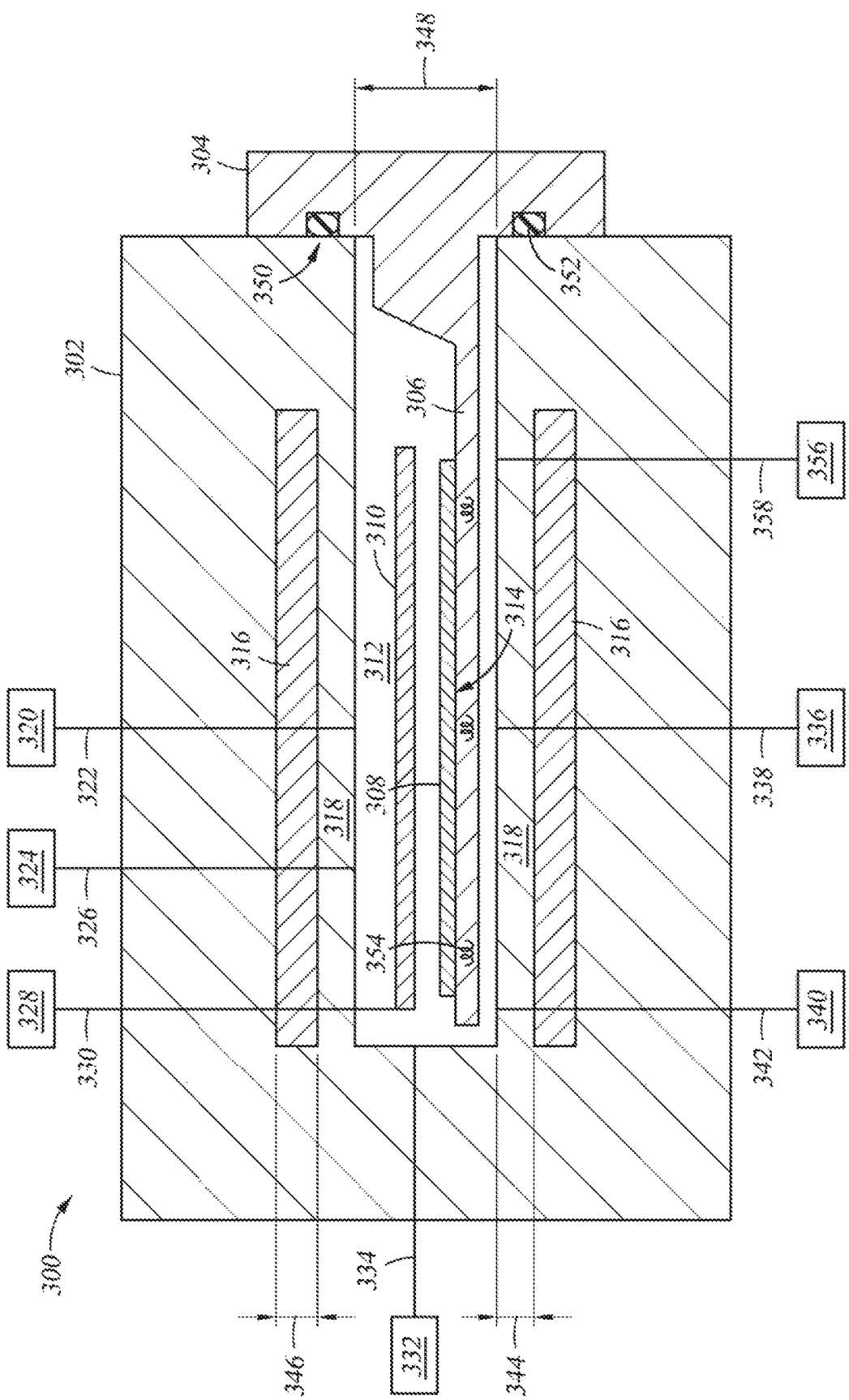
FIG. 3 schematically illustrates a cross-sectional view of a reduced volume processing chamber according to one embodiment described herein.

FIG. 3 schematically illustrates a cross-sectional view of a reduced volume processing chamber 300 according to one embodiment described herein. In certain embodiments, the chamber 300 may be implemented as the chamber 203 described with regard to FIG. 2A and FIG. 2B. Generally, the chamber 300 is configured to withstand pressurization suitable for generation and/or maintenance of a supercritical fluid therein. The chamber 300 may also be advantageously cycled within a temperature range suitable for performing phase transitions.

The chamber 300 includes a body 302, a liner 318, and an insulation element 316. The body 302 and the liner 318 generally define a processing volume 312. The body 302 may be configured to withstand pressures suitable for generating a supercritical fluid within the processing volume 312. For example, the body may be suitable for withstanding pressures of about 100 bar or greater. Suitable materials for the body 302 include stainless steel, aluminum, or other high strength metallic materials. The liner 318 may also be formed from materials similar to the body 302. In one embodiment, the liner 318 and the body 302 may be a unitary apparatus. In another embodiment, the liner 318 and the body 302 may be separate apparatus coupled together.

The liner 318, at regions adjacent the processing volume 312, may have a thickness 344 of between about 2 mm and about 5 mm, such as about 3 mm. The relatively minimal amount of material comprising the liner 318 compared to the body 302 causes the liner 318 to have a small thermal mass relative to the thermal mass of the body 302. Accordingly, temperature changes within the processing volume 312 may be made in a more efficient manner as the temperature of the processing volume 312 is influenced predominantly by the liner 318, rather than the body 302. In one embodiment, a processing environment within the processing volume 312 may be cycled between about 20° C. and about 50° C. in an amount of time less than about 5 minutes, for example less than about 1 minute. In one embodiment, the processing volume 312 may be cycled between about 20° C. and about 50° C. in about 30 seconds.

The insulation element 316 is generally disposed within the body 302 adjacent the liner 318. In the illustrated embodiment, the insulation element 316 may be multiple apparatus. The insulation element 316 may general extend along a long axis of the processing volume 312 to further reduce the thermal mass of the liner 318 by insulating the liner 318 from the body 302. The insulation element 316 may be formed form a material suitable for use in a high pressure environment which has a coefficient of thermal expansion similar to the coefficient of thermal expansion for the materials utilized for the body 302 and the liner 318. In one embodiment, the insulation element 316 may be a ceramic material. Various examples of ceramic materials include aluminum oxide, aluminum nitride, silicon carbide, and the like. A thickness 346 of the insulation element 316 may be between about 0.1 inches and about 1.0 inch, such as about 0.5 inches.

The processing volume 312 has a volume of less than about 2 liters, for example, about 1 liter. A distance 348 spanning the processing volume 312 between the liner 318 may be less than about 5 cm, such as less than about 2 cm, for example, about 1 cm. In various embodiments, the processing volume 312 may be filled with various liquids, gases, and/or supercritical fluids depending on the conditions in the processing volume 312. In one embodiment, the processing volume 312 may be coupled to one or more solvent sources 320, 332, 336. A first solvent source 320 may be coupled to the processing volume 312 via a first conduit 322 through a top of the body 302. A second solvent source 332 maybe coupled to the processing volume 312 via a second conduit 334 through a sidewall of the body 302. A third solvent source 336 may be coupled to the processing volume 312 via a third conduit 338 through a bottom of the body 302. The solvent sources 320, 332, 336 may be configured to provide solvents to the processing volume from various entry ports, depending upon desired solvent introduction characteristics.

Suitable solvents which may be supplied to the processing volume 312 from the solvent sources 320, 332, 336 include acetone, isopropyl alcohol, ethanol, methanol, N-Methyl-2-pyrrolidone, N-Methylformamide, 1,3-Dimethyl-2-imidazolidinone, dimethylacetamide, and dimethyl sulfoxide, among others. Generally the solvent may be selected such that the solvent is miscible with liquid $CO_2$.

A first fluid source 324 may be coupled to the processing volume 312 via fourth conduit 326 through the top of the body 302. The first fluid source 324 is generally configured to provide a liquid or supercritical fluid to the processing volume 312. In one embodiment, the first fluid source 324 may be configured to deliver supercritical $CO_2$. In another embodiment, the fluid source 324 may be configured to deliver supercritical $CO_2$ to the processing volume 312. In this embodiment, heating apparatus and pressurization apparatus may be coupled to the fourth conduit 326 to facilitate phase transition of liquid $CO_2$ to supercritical $CO_2$ prior to entry into the processing volume 312. A second fluid source 356 may be similarly configured to the first fluid source 324. However, the second fluid source 356 may be coupled to the processing volume via a fifth conduit 358 through the bottom of the body 302. Delivery of liquid $CO_2$ and/or supercritical $CO_2$ may be selected from a top down (first fluid source 324) or bottom up (second fluid source 356) scheme, depending upon desired processing characteristics.

In operation, temperature of the processing volume 312 may be controlled, at least in part, by the temperature of the $CO_2$ provided to the processing volume 312. Additionally, liquid $CO_2$ and/or supercritical $CO_2$ may be provided to the processing volume 312 in an amount such that the entire processing volume is exchanged between about 1 time and about 5 times, for example, about 3 times. It is believed that repetitive processing volume turnover may facilitate solvent mixing with the $CO_2$ prior to formation of and/or delivery of supercritical $CO_2$ to the processing volume 312 during subsequent supercritical drying operations. To facilitate turnover and removal of fluids and gases from the processing volume 312, the processing volume 312 may be coupled to a fluid outlet 340 via a sixth conduit 342.

The chamber 300 also includes a substrate support 306 which may be coupled to a door 304 and a baffle plate 310 may be movably disposed within the processing volume 312. In one embodiment, the substrate support 306 and the door 304 may be a unitary apparatus. In another embodiment, the substrate 306 may be removably coupled to the door 304 and may move independently of the door 304. The door 304 and the substrate support 306 may be formed from various materials, including stainless steel, aluminum, ceramic material, polymeric materials or combinations thereof. The substrate support 306 may also have a heating element 354 disposed therein. The heating element 354 may be a resistive heater in one embodiment. In another embodiment, the heating element 354 may be a fluid filled channel formed in the substrate support 306. The heating element 354 may be configured to heat the processing volume 312 to facilitate formation or maintenance of a supercritical fluid in the processing volume 312.

In operation, the substrate support 306 may enter the processing volume 312 via an opening formed in the body 302 and the door 304 may be configured to abut the body 302 when the substrate support 306 is positioned within the processing volume 312. In one embodiment, the substrate support 306 is configured to move laterally. As a result, the distance 348 may be minimized because vertical movement of the substrate support 306 within the processing volume 312 is unnecessary. A seal 352, such as an o-ring or the like, may be coupled to the body 302 and the seal 352 may be formed from an elastomeric material, such as a polymeric material. Generally, the door 304 may be secured to the body 302 during processing via coupling apparatus (not shown), such as bolts or the like, with sufficient force to withstand a high pressure environment suitable to forming or maintaining a supercritical fluid in the processing volume 312.

The baffle plate 310 may be formed from various materials, including stainless steel, aluminum, ceramic materials, quartz materials, silicon containing materials, or other suitably configured materials. The baffle plate 310 may be coupled to an actuator 330 configured to move the baffle plate 310 towards and away from the substrate support 306. The actuator 330 may be coupled to a power source 328, such as an electrical power source to facilitate movement of the baffle plate 310 within the processing volume 312.

A substrate 308 may be positioned on the substrate support 306 during processing. In one embodiment, a device side 314 of the substrate 308 may be positioned adjacent to the substrate support 306 such that the device side 314 faces away from the baffle plate 310. In operation, the baffle plate 310 may be in a raised position when the substrate 308 is being positioned within the processing volume 312. The baffle plate 310 may be lowered via the actuator 330 to a processing position in close proximity with the substrate 308 during processing. After processing, the baffle plate 310 may be raised and the substrate support 306 may remove the substrate 308 from the processing volume 312 through the opening 350 in the body 302. It is believed that by positioning the baffle plate 310 in close proximity with the substrate 308 and the substrate support 306, particle deposition on the device side 314 of the substrate 308 may be reduced or eliminated during introduction of solvents and/or liquid/supercritical $CO_2$ to the processing volume 312.

Figure 4:
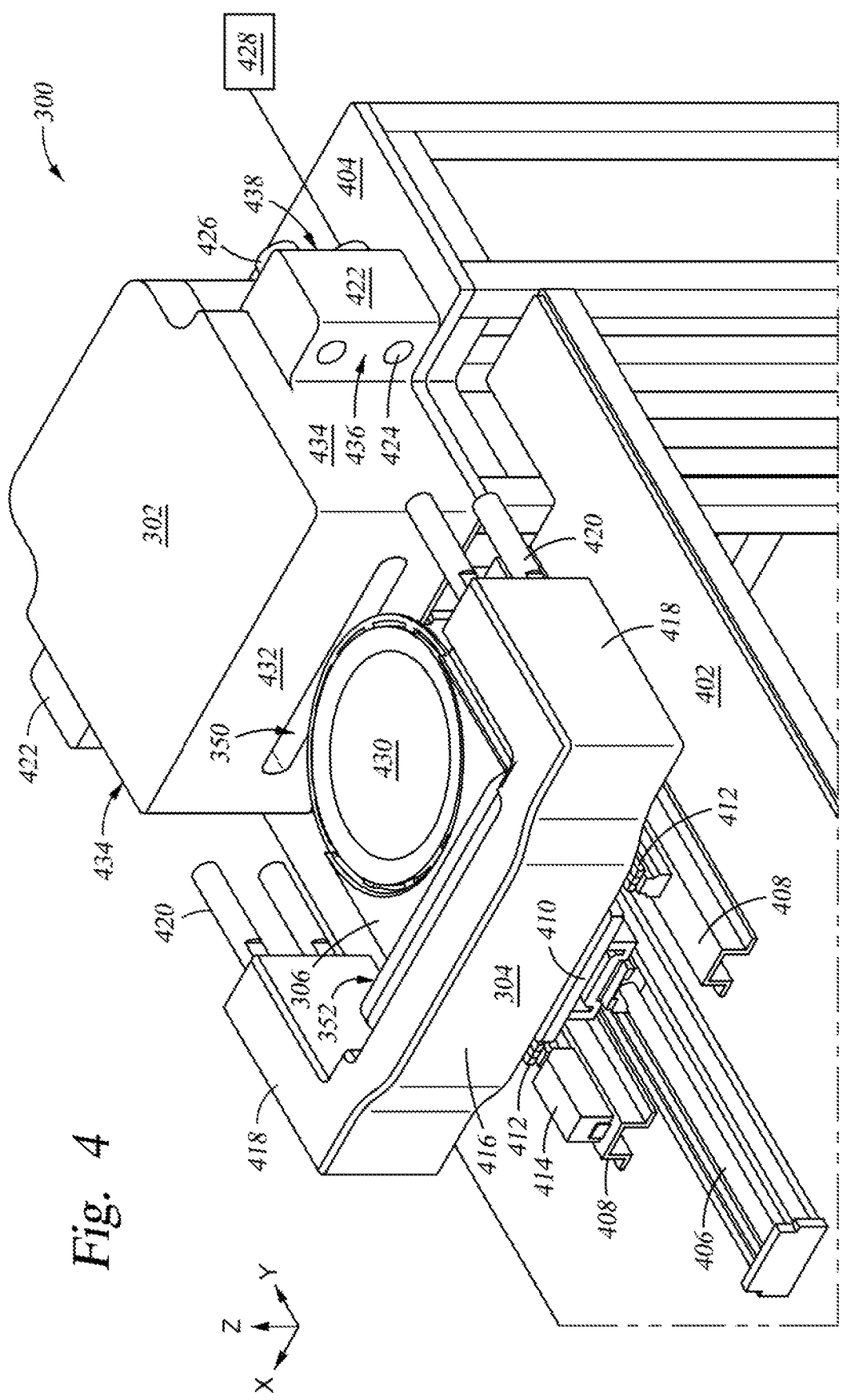
FIG. 4 illustrates a perspective view of the reduced volume processing chamber according to one embodiment described herein.

FIG. 4 illustrates a perspective view of the chamber 300 according to embodiments described herein. In the illustrated embodiment, the door 304 is disposed in a position separated from the body 302. In this position, the substrate support 306 may receive a substrate from a robot, such as the robot 208A. The substrate (not shown) may be positioned on a support plate 430 configured to support the device side of the substrate. In operation, once the substrate has been positioned on the support plate 430 of the substrate support 306, the door 304 and/or the substrate support 306 may translate laterally towards the body 302. As described above, the substrate support 306 may move independently of the door 304 in certain embodiments. The substrate support 306 may move through the opening 350 and the door 304 may move to a position in contact with sidewall 432 of the body 302. The seal 352 may be coupled to the substrate support 306 in one embodiment or to a surface of the door 304 which abuts the sidewall 432 in a closed position. Although not shown, the seal 352 may also be coupled to the sidewall 432.

The door 304 generally includes a first portion 416 and a second portion 418. The first portion 416 may be configured to abut and contact the sidewall 432 in the closed position. The second portion 418 may extend from first portion 416 in a direction perpendicular to the first portion 416. A distance between the second portions 418 may be greater than a width of the sidewall 432 such that the second portions 418 are disposed adjacent sidewalls 434 when the door 304 is in the closed position. One or more coupling elements 420, such as bolts or the like, may extend from each of the second portions 418. The coupling elements 420 may be configured to interface with a coupling body 422 which is disposed on the body 302. In one embodiment, the coupling body 422 is an extension of the body 302 such that the body 302 and the coupling body 422 are a unitary apparatus. In another embodiment the coupling body 422 may be a separate apparatus coupled to the body 302.

The coupling body 422 may include one or more holes 424 formed therein sized to accommodate insertion of the coupling elements 420 into the holes 424. In one embodiment, the holes 424 may extend through the coupling body 422 from a first surface 436 of the coupling body 422 to a second surface 438 of the coupling body 422. One or more fasteners 426, such as nuts or the like, may be coupled to the second surface 438. In one embodiment, the fasteners 426 may be coupled to an actuator 428 configured to secure the fasteners 426 to the coupling elements 420 when the coupling elements 420 are disposed within the holes 424. The coupling elements 420 and the fasteners 426 may be formed from materials similar to the materials utilized to manufacture the body 302 and the door 304. Generally, the coupling elements 420, the coupling body 422, and the fasteners 426 form a pressure closure to urge the door 304 against the body 302 with sufficient force to maintain an elevated pressure, such as about 100 bar or greater, within the processing volume 312.

The substrate support 306 may be coupled to a bracket 410 slidably disposed on a first track 406. In one embodiment, the bracket 410 may include various translation elements (not shown), such as ball bearings or the like, configured to move laterally along a length of the first track 406. In another embodiment, the translation elements may be coupled to the first track 406 and the bracket 410 may be configured to slidably interface with the first track 406. The first track 406 may enable the substrate support 306 to move independently of the door 304. As such, a motor 414 may be coupled to the bracket 410 and the motor 414 may coordinate movement of the bracket 410 along the first track 406.

The door 304 may be coupled to one or more slider assemblies 412 disposed on one or more second tracks 408. In one embodiment, two second tracks 408 may be disposed adjacent the first track 406. Generally, the first track 406 and the second tracks 408 may be coupled to a first platform 402. Similar to the bracket 410, the slider assemblies 412 may include translation elements (not shown), such as ball bearings or the like, configured to move laterally along the length of the second tracks 408. In another embodiment, the translation elements may be may be coupled to the second tracks 408 and the slider assemblies 412 may be configured to slidably interface with the second tracks 408. The motor 414 may also be coupled to the slider assemblies 412 and the motor may coordinate movement of the slider assemblies 412 along the second tracks 408. As discussed, the motor 414 may coordinate movement of the substrate support 306 and the door 304 via the bracket 410 and the slider assemblies 412, respectively. In another embodiment, the motor 414 may be coupled to the slider assemblies 412 and another motor (not shown) may be coupled to the bracket 410.

The body 302 may be disposed on a second platform 404 and the second platform 404 may be disposed adjacent to the first platform 402. In one embodiment, the second platform 404 may orient the body 302 in a position elevated from a top surface of the first platform 402. However, regardless of the orientation of the body 302 on the second platform 404 and the orientation of the door 304/substrate support 306 on the first platform 402, the substrate support 306 and door 304 are configured to move in a single plane. Accordingly, translation along the Z-axis may be avoided when the substrate support 306 is disposed within the body 302. As a result, the processing volume 312 may be reduced because substrate positioning along the Z-axis in the processing volume 312 is unnecessary.

By reducing the volume of the processing volume 312, the efficiency of temperature cycling of the chamber 300 may be improved when performing phase transition processes. Moreover, design complexities of substrate positioning within the processing volume 312 may be avoided by positioning the substrate on the support plate 430 coupled to the substrate support 306 prior to entry of the substrate into the body 302. In addition, the ability to move the door 304 and substrate support 306 independently of one another may provide for improved throughput by coordinating movement in an efficient manner. Still further, enabling utilization of a reduced processing volume may reduce the costs associated with performing supercritical drying processes as a result of reducing the amount of fluids utilized during processing.

While the foregoing is directed to embodiments of the present disclosure, other and further embodiments of the disclosure may be devised without departing from the basic scope thereof, and the scope thereof is determined by the claims that follow.

What is claimed is:

1. A processing chamber, comprising:
   a chamber body;
   a first track extending in a first direction;
   one or more second tracks extending in the first direction;
   a door coupled to one or more slider assemblies that are slidably interfaced with and movable on the one or more second tracks, the door comprising:
   a first portion extending in a first plane perpendicular to the first direction; and
   two second portions disposed proximate to opposite ends of the first portion and extending therefrom in a second plane parallel to the first direction;
   a liner disposed inside of the chamber body, wherein the liner and the chamber body collectively define a processing volume;
   a substrate support assembly coupled to a bracket, which is slidably interfaced and movable on the first track, the substrate support assembly comprising a substrate support having a support surface to support a to be processed substrate disposed in a horizontal position, wherein the substrate support assembly is configured to move the to be processed substrate disposed on the support surface into and out of the processing volume through a slit shaped opening formed in a wall of the chamber body independently of the door;
   a motor coupled to the bracket, wherein the motor coordinates movement of the bracket along the first track; and one or more insulating elements interposed between the liner and the chamber body, wherein at least one of the one or more insulating elements is disposed between a heating element of the substrate support and the chamber body when the substrate support is in the processing volume.

2. The processing chamber of claim 1, wherein the liner has a thickness of 2 mm to 5 mm.

3. The processing chamber of claim 1, wherein the substrate support is operable to move laterally into and out of the processing volume and the door is operable to move laterally towards and away of the chamber body.

4. The processing chamber of claim 1, wherein a distance spanning the processing volume between the liner is less than 5 cm.

5. The processing chamber of claim 1, wherein at least one of the one or more insulation elements has a thickness between 0.1 inches and 1.0 inch.

6. The processing chamber of claim 5, wherein at least one of the one or more insulation elements is ceramic.

7. The processing chamber of claim 1, wherein the processing volume defined by the liner and the chamber body is less than 2 L.

8. The processing chamber of claim 7, further comprising a baffle plate horizontally disposed within the processing volume and coupled to an actuator operable to move the baffle plate within the processing volume towards or away from the substrate support when the substrate support is in the processing volume.

9. The processing chamber of claim 1, wherein one or more coupling elements respectively extend from each of the two second portions of the door.

10. The processing chamber of claim 9, wherein one or more coupling bodies are fixedly coupled to the chamber body, wherein each of the one or more coupling bodies are configured to receive a corresponding coupling element.

11. A processing chamber, comprising:
a chamber body having a slit shaped opening formed therein for ingress and egress from a processing volume defined by a liner of the chamber body;
a baffle plate disposed within the processing volume and coupled to an actuator to move the baffle plate within the processing volume;
a door slidably coupled to the chamber body, wherein the door is configured to translate between an open position and a closed position in a first direction;
a substrate support coupled to the door, the door comprising a first portion extending in a plane perpendicular to the first direction, and two second portions disposed proximate to opposite ends of the first portion and extending therefrom in a second plane parallel to the first direction, wherein the substrate support is configured to translate independently of the door between a first position outside of the processing volume and a second position inside the processing volume, and wherein the baffle plate is moveable independently of the substrate support, and wherein the substrate support remains in the second position during substrate processing;
a bracket coupled to the substrate support and slidably disposed on a first track; and
a motor coupled to the bracket, wherein the motor coordinates movement of the bracket along the first track, wherein the door is coupled to one or more second tracks.

12. The processing chamber of claim 11, wherein the liner has a thickness of 2 mm to 5 mm.

13. The processing chamber of claim 11, wherein the chamber body comprises an insulation element with a thickness between 0.1 inches and 1.0 inch, wherein the insulation element is positioned to insulate the liner from the chamber body.

14. The processing chamber of claim 13, wherein the insulation element is ceramic.

15. The processing chamber of claim 11, wherein the processing volume defined by the liner and the chamber body is less than 2 L.

16. A processing chamber, comprising:
a chamber body having a slit shaped opening formed therein for ingress and egress from a processing volume defined by a liner of the chamber body;
a door slidably coupled to the chamber body, wherein the door is configured to translate between an open position and a closed position in a first direction;
a substrate support coupled to the door, the door comprising a first portion extending in a plane perpendicular to the first direction, and two second portions disposed proximate to opposite ends of the first portion and extending therefrom in a second plane parallel to the first direction, wherein the substrate support is configured to translate independently of the door between a first position outside of the processing volume and a second position inside the processing volume;
a baffle plate disposed within the processing volume and coupled to an actuator to move the baffle plate within the processing volume, wherein the actuator is operable to selectively move the baffle plate between a processing position adjacent to the substrate support and a raised position away from the substrate support, wherein the baffle plate is moveable independently of the substrate support, and wherein the substrate support remains in the second position during substrate processing;
a bracket coupled to the substrate support and slidably disposed on a first track; and
a motor coupled to the bracket, wherein the motor coordinates movement of the bracket along the first track, wherein the door is coupled to one or more second tracks.

17. The processing chamber of claim 16, further comprising a pressure closure operable to urge the door against the chamber body.

18. The processing chamber of claim 17, wherein the pressure closure comprises the actuator.

* * * * *